Jan. 30, 1968 A. HERLET ET AL 3,366,851
STABILIZED PNPN SWITCH WITH ROUGH AREA SHORTED JUNCTION
Filed Nov. 13, 1964
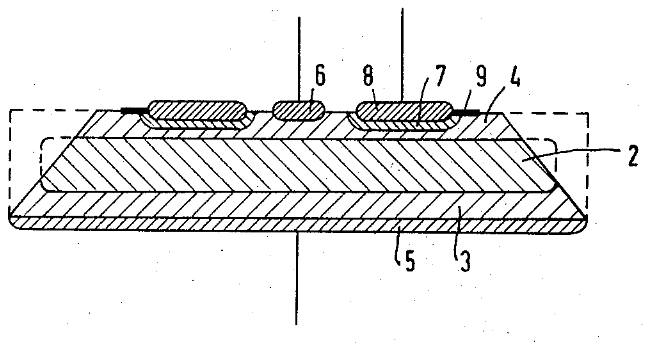

United States Patent Office 3,366,851

Patented Jan. 30, 1968

3,366,851

STABILIZED PNPN SWITCH WITH ROUGH AREA SHORTED JUNCTION

Adolf Herlet, Pretzfeld, Offenbach, and Götz von Bernuth, Munich, Germany, assignors to Siemens-Schuckertwerke Aktiengesellschaft, Berlin-Siemensstadt, Germany, a corporation of Germany Filed Nov. 13, 1964, Ser. No. 410,851
Claims priority, application Germany, Nov. 16, 1963, S 88,315
5 Claims. (Cl. 317—235)

Our invention relates to pnpn type semiconductor devices. More particularly, our invention relates to pnpn type semiconductor devices suitable as controlled rectifiers, latching switches and the like thyristors.

Such semiconductor devices have an essentially monocrystalline semiconductor body with three p-n junctions between four layers or regions of alternately different type of conductance. As a rule, such a semiconductor device is made of silicon, although germanium and semiconductor compounds are also applicable.

Once a four-layer thyristor has been triggered into conductance, it remains conductive until the load current declines to a minimum value near zero or is interrupted by external switching means. Triggering may be effected by increasing the applied voltage above a given breakdown value. Another way of triggering is to provide the thyristor with a control or gate electrode which permits firing the thyristor by supplying a current pulse.

The two outer layers or regions of mutually opposed conductance type, which are always contacted by respective electrodes, are called "emitters" and the two intermediate regions are called "bases." When a gate electrode is provided it is attached to only one of the two bases.

It is known that the emitter efficiency or the operating characteristic of a thyristor can be improved by connecting between one of the emitters and the adjacent base a resistor which is sufficiently small to secure drainage of the minority charge carriers. In some cases, this resistor may be reduced down to the zero value; that is, a short-circuit may be provided between the emitter and the appertaining base.

German published patent application No. DAS 1,154,872 describes a semiconductor four-layer device of the thyristor type in which the p-n junction between a base and the adjacent emitter is partially bridged by a metallic electrode attached to the semiconductor surface. This improves the characteristic of the semiconductor device, particularly in increasing the blocking voltage and improving the temperature stability of the blocking voltage.

German published patent application No. DAS 1,144,849 discloses a semiconductor controlled rectifier of the pnpn type in which the p-n junction between a base and the adjacent emitter is partially short-circuited. In this device, the entire edge of the p-n junction where it emerges at the semiconductor surface and which surrounds the emitter electrode is short-circuited with the exception of a short gap. The base connection serving as the gate electrode is positioned in the vicinity of the gap locality which is not short-circuited. The short-circuiting layer consists of metal.

German published patent application No. DAS 1,133,038 describes a semiconductor four-layer device in which an electrically conducting coating, acting as a shunt, covers the p-n junction between the base region and the appertaining emitter region. This electrically conducting coating may also consist of metal, a metal-containing varnish, or an oxide or graphite.

More particularly, our invention relates to a new and improved four-layer semiconductor device of pnpn type having an essentially monocrystalline semiconductor body, preferably of silicon, and four regions of alternately different conductance type as well as two contact electrodes located on the two outer regions and one contact electrode located on one of the intermediate regions.

It is an object of our invention to secure in four-layer pnpn type semiconductor devices a more precisely defined and more stable firing voltage at which the device is triggered into conductance.

Another object of the invention is to provide in a four-layer pnpn type semiconductor device for a thermally stable surface conductance of the semiconductor body across the locality where the base-to-emitter junction emerges at the surface, in a manner which permits a particularly simple and low-cost method of production.

Still another object of the invention, in conjunction with the aforementioned objects, is to permit reducing the over-all dimensions of the thyristor device for otherwise equal requirements and qualities.

In accordance with the present invention, one of the flat sides of the disc-shaped semiconductor body of a four-layer pnpn type semiconductor device includes the contacted intermediate region which constitutes one of the aforementioned base regions, and the next adjacent outer region is embedded into the surface region in the shape of an annular layer. The annular layer and the intermediate region which carries the gate electrode together form an annular p-n junction which emerges at the body surface around the annular layer. The gate electrode contacting the intermediate region is located in the central opening of the annular region. The boundary line of the p-n junction extending around the annular layer at the semiconductor surface is bridged by a likewise annular surface area of greater roughness, and thus higher surface conductance, than is exhibited by the semi-conductor surface between the annular layer and the intermediate region contact electrode. The annular surface area of great roughness which bridges the external boundary of the p-n junction around the annular layer may be produced by sand-blasting.

By virtue of the resulting differentiation in the surface characteristics of the area in which the bridging of the p-n junction between emitter and base is effected, as compared with the surface area of the base from which the thyristor is fired by means of the gate or control electrode, a considerable improvement with respect to a precisely defined firing or trigger voltage is achieved, particularly in comparison with thyristors as mentioned with reference to German published patent application No. DAS 1,144,849.

In order that the present invention may be readily carried into effect, it will now be described with reference to the accompanying drawing, wherein the single figure is a sectional view of an embodiment of a thyristor of the present invention, suitable as a silicon controlled rectifier or latching switch, on an enlarged scale with exaggerated vertical thickness values.

The illustrated thyristor consists essentially of a circular, disc-shaped semiconductor body of n-type silicon. It is produced as follows. First, an acceptor is diffused into the silicon disc, thus producing a closed surface region of p-type conductance. The enveloping surface region is thereafter divided into two separate regions, for example by etching a circular groove into the silicon body down to a depth larger than the depth of the p-doped surface region.

Another way of dividing the p-type surface region into two separate regions is to cut a circumferential portion away from the semiconductor disc, the latter method being applied to the illustrated embodiment. That is, the entire circumferential edge portion shown by broken lines and denoted by 2*a* is mechanically removed, for example by grinding or sand-blasting. As a result, two p-type regions 3 and 4 remain on the core region 2 in which the original n-type conductance is preserved.

A donor substance is then alloyed into an annular region 7 so that it forms an emitter layer embedded in the top surface region 4. The annular region 7 may be produced for example by placing on top of the semiconductor disc of gold foil containing about 1% by weight antimony and in the configuration of a ring. When the gold foil ring is alloyed into the semiconductor body, there results not only the alloyed and n-doped layer 7 but also a contact electrode 8 consisting essentially of a gold-silicon eutectic.

In the same or the next following processing step, two contact electrodes 5 and 6 are attached to the regions 3 and 4, respectively. For example, a boron-containing gold foil of circular shape is alloyed into the semiconductor body at the proper localities, the diameter of the gold foil being rather small for the electrode 6 but being just as large as that of the semiconductor disc, for the electrode 5. The completed device thus constitutes a four-layer structure in which the layers 3, 2, 4, 7 have the necessary pnpn sequence.

On the top surface of the semiconductor body thus produced, an annular area 9 is given greater roughness by sand-blasting. The roughened surface area 9 fully encloses or surrounds the entire electrode 8. Consequently the p-n junction formed by the annular n-type layer 7 and the p-type region 4 emerges at the top surface of the semiconductor within the roughened annular surface area 9. Consequently, the desired improvement of the surface conductance in the sand-blasted area 9 has the effect of bridging the p-n junction at all localities around the entire electrode 8 and hence around the entire boundary line of the p-n junction. This considerably improves the temperature stability of the semiconductor device with respect to its firing voltage.

On the other hand, no undesired increase of the required control current is encountered because, due to the geometry of the semiconductor device, the control current flows mainly between the control or gate electrode 6 and the contact electrode 8 on the shortest path through the semiconductor material. The control current thus passes by the p-n junction between the regions 4 and 7 virtually only at the inner edge of the contact electrode 8, but not at the outer edge where the junction is bridged by the rough surface area 9.

The semiconductor device of the present invention is also advantageous from the viewpoint of manufacture. For example, the said-blasted surface area 9 is rather easily produced, and the desired roughness of conductance values can be obtained in a defined manner by a short blasting treatment. After the contact electrodes are alloyed into the semiconductor body and after the regions 3 and 4 are separated by mechanical removal of the circumferential portion 2*a*, the entire semiconductor member may be etched in the conventional manner. Thereafter, it is only necessary to roughen the annular area 9 of the surface of the semiconductor body.

After the surface area 9 of the semiconductor body is roughened, the device is ready to be encapsulated. In contrast thereto, semiconductor members with attached metal layers have always more likely than not required a second etching treatment after vapor deposition or other attachment of metal layers. Such subsequent etching treatment may drag metal ions along the surface of the semiconductor body and thus cause undesired leakage currents. A semiconductor device in accordance with the present invention thus avoids not only the need for a repetition of the etching process, but in many cases also avoids impairment of the electrical properties of the device.

Another advantage of the semiconductor device of the present invention is the fact that the over-all design can be kept smaller so as to result in the better utilization of the semiconductor material which constitutes the disc. Experience has shown that a coating, for example of metal, requires a width of at least about 1 mm. and that a marginal area on the disc surface of about 2 mm. must remain blank to provide a safety spacing with respect to etching liquid which may otherwise reach the surface when the p-n junctions between the regions 2 and 3 and between the regions 2 and 4 are being etched.

A surface area which is simply roughened according to the invention, such as by sand-blasting from a fine nozzle, can be kept much narrower and does not require a safety distance from the edge of the semiconductor disc because it does not cause any disturbance of the etching operation or, as hereinbefore mentioned, may even permit the avoidance of subsequent etching.

Upon a study of this disclosure it will be obvious to those skilled in the art that devices according to our invention may be modified in various respects, such as regards individual materials and particular shapes, and hence may be given embodiments other than particularly illustrated and described herein, without departing from the essential features of our invention and within the scope of the claims annexed hereto.

We claim:

1. A semiconductor device adapted to be switched to a conductive condition by a firing voltage, said semiconductor device comprising a substantially monocrystalline semiconductor body of disc shape having four regions of alternately opposed conductance type and having three contacts joined respectively with the two outer regions and one of the two intermediate regions, said one intermediate region extending along one disc side of said body and the adjacent one of said outer regions forming an annular layer on said one intermediate region and surrounding said contact of said one intermediate region, said annular layer and said one intermediate region forming an annular p-n junction which emerges at the body surface around said annular layer, and said body having on said one side an annular surface area of greater roughness and correspondingly greater surface conductance than between said annular layer and said intermediate region contact, said annular area bridging said emerging p-n junction around said annular layer and completely surrounding said annular layer for providing a stable firing voltage and thermally stable surface conductance of the semiconductor body.

2. A semiconductor device adapted to be switched to a conductive condition by a firing voltage, said semiconductor device comprising a substantially flat disc of substantially monocrystalline silicon having four regions of alternately opposed conductance type and having three contacts joined respectively with the two outer regions and one of the two intermediate regions, said one intermediate region extending along one flat side of said disc, the other disc side being substantially fully occupied by the one of said outer regions that is non-adjacent to said one intermediate region, the other outer region forming an annular layer on said one intermediate region and surrounding said contact of said one intermediate region, said annular layer and said one intermediate region forming an annular p-n junction which emerges at the disc surface around said annular layer, and said disc having on said one side an annular surface area having greater roughness than the silicon surface between said annular layer and said intermediate region contact, said annular area bridging said emerging p-n junction around said annular layer and completely surrounding said annular layer for providing a stable firing voltage and thermally stable surface conductance of the semiconductor body.

3. A semiconductor pnpn type device adapted to be switched to a conductive condition by a firing voltage, said semiconductor device comprising a circular flat disc of substantially monocrystalline silicon having four regions of alternately different conductance type and having three contacts joined respectively with said two outer regions and the p-type intermediate region, said p-type intermediate region extending along one flat side of said disc, the n-type intermediate region and the p-type outer region extending substantially through the entire cross section of the disc with said p-type outer region occupying the other disc side, the n-type outer region forming an annular layer on said p-type intermediate region and surrounding said contact of said p-type intermediate region, said annular layer and said p-type intermediate region forming an annular p-n junction which emerges at the disc surface around said annular layer, and said disc having on said one side an annular area of greater roughness and greater surface conductance than the silicon surface between said annular n-type layer and said p-type intermediate region, said annular area bridging said emerging p-n junction around said annular layer and completely surrounding said annular layer for providing a stable firing voltage and thermally stable surface conductance of the semiconductor body.

4. In a semiconductor device adapted to be switched to a conductive condition by a firing voltage, said semiconductor device having a semiconductor body with a surface, an annular layer on said surface and a p-n junction emerging at said surface, an area of greater roughness than that of said surface bridging said emerging p-n junction and completely surrounding said annular layer for providing a stable firing voltage and thermally stable surface conductance of the semiconductor body.

5. In a semiconductor device as claimed in claim 4, wherein said p-n junction is of annular configuration and said area of greater roughness is of annular configuration.

References Cited

UNITED STATES PATENTS

| | | | |
|---|---|---|---|
| 2,849,664 | 8/1958 | Beale | 317—234 |
| 2,935,453 | 5/1960 | Saubestre | 317—235 |
| 3,196,327 | 7/1965 | Dickson | 317—234 |
| 3,209,428 | 10/1965 | Barbaro | 29—25.3 |
| 3,262,234 | 7/1966 | Roach | 51—320 |

JAMES D. KALLAM, *Primary Examiner.*

JOHN W. HUCKERT, *Examiner.*

R. F. SANDLER, *Assistant Examiner.*